(12) United States Patent
Fan et al.

(10) Patent No.: US 11,251,382 B2
(45) Date of Patent: Feb. 15, 2022

(54) ORGANIC ELECTROLUMINESCENT DEVICES AND MANUFACTURING METHODS THEREOF

(71) Applicant: SUZHOU QINGYUE OPTOELECTRONICS TECHNOLOGY CO., LTD., Kunshan (CN)

(72) Inventors: Yanliu Fan, Kunshan (CN); Gaomin Li, Kunshan (CN); Yao Hong, Kunshan (CN)

(73) Assignee: SUZHOU QINGYUE OFTOELECTRONICS TECHNOLOGY CO., LTD., Kunshan (CN)

( * ) Notice: Subject to any disclaimer, the term of this patent is extended or adjusted under 35 U.S.C. 154(b) by 413 days.

(21) Appl. No.: 16/304,128

(22) PCT Filed: Aug. 9, 2017

(86) PCT No.: PCT/CN2017/096646
§ 371 (c)(1),
(2) Date: Nov. 21, 2018

(87) PCT Pub. No.: WO2018/028605
PCT Pub. Date: Feb. 15, 2018

(65) Prior Publication Data
US 2020/0328362 A1 Oct. 15, 2020
US 2021/0257566 A9 Aug. 19, 2021

(30) Foreign Application Priority Data

Aug. 11, 2016 (CN) .......................... 201610656754.1

(51) Int. Cl.
*H01L 29/08* (2006.01)
*H01L 51/00* (2006.01)
(Continued)

(52) U.S. Cl.
CPC ...... *H01L 51/0097* (2013.01); *H01L 27/3246* (2013.01); *H01L 51/001* (2013.01);
(Continued)

(58) Field of Classification Search
CPC ... H01L 27/28; H01L 27/288; H01L 27/3246; H01L 51/001; H01L 51/0018;
(Continued)

(56) References Cited

U.S. PATENT DOCUMENTS

2005/0276947 A1* 12/2005 Huang ................ H01L 51/5259
428/76
2606/0181204 8/2006 Furong et al.
(Continued)

FOREIGN PATENT DOCUMENTS

TW I269606 B 12/2006
TW 201314956 A 4/2013
(Continued)

OTHER PUBLICATIONS

International Search Report dated Nov. 10, 2017 in the corresponding CN application (application No. PCT/CN2017/096646).
(Continued)

*Primary Examiner* — Brook Kebede
(74) *Attorney, Agent, or Firm* — Kilpatrick Townsend & Stockton

(57) ABSTRACT

An organic electroluminescent device includes a substrate, a number of first electrodes disposed on the substrate, each of the first electrodes used to form a light-emitting unit; an insulative layer disposed on the substrate and used to define a pixel region of the light-emitting unit; a number of second electrodes disposed on the substrate, each of the second electrodes used to form a light-emitting unit, wherein the
(Continued)

second electrodes are spaced apart from one another to form a number of isolation grooves each between two adjacent second electrodes.

10 Claims, 2 Drawing Sheets

(51) Int. Cl.
  *H01L 27/32* (2006.01)
  *H01L 51/52* (2006.01)
  *H01L 51/56* (2006.01)
(52) U.S. Cl.
  CPC ...... *H01L 51/0018* (2013.01); *H01L 51/0023* (2013.01); *H01L 51/5206* (2013.01); *H01L 51/5221* (2013.01); *H01L 51/56* (2013.01); H01L 2227/323 (2013.01); H01L 2251/301 (2013.01); H01L 2251/308 (2013.01); *H01L 2251/5338* (2013.01)
(58) Field of Classification Search
  CPC ............. H01L 51/0097; H01L 51/0023; H01L 51/5206; H01L 51/5221; H01L 51/56
  USPC .......................................................... 257/40
  See application file for complete search history.

(56) References Cited

U.S. PATENT DOCUMENTS

| | | | |
|---|---|---|---|
| 2007/0096643 A1* | 5/2007 | Maglione | ............ H01L 27/3246 313/506 |
| 2014/0191202 A1 | 7/2014 | Shim et al. | |
| 2015/0340642 A1 | 11/2015 | Yasushi et al. | |
| 2015/0340650 A1 | 11/2015 | Hayato et al. | |
| 2016/0372697 A1* | 12/2016 | Kakizoe | .................. H01L 51/56 |

FOREIGN PATENT DOCUMENTS

| | | |
|---|---|---|
| TW | 201436328 A | 9/2014 |
| TW | 201438308 A | 10/2014 |
| TW | I532221 B | 5/2016 |
| WO | 2010061898 A1 | 6/2010 |

OTHER PUBLICATIONS

CN First Office Action dated Nov. 9, 2018 with a CN search report(dated Oct. 29, 2018) in the corresponding CN application(application No. 201610656754.1).

TW First Office Action dated Sep. 10, 2018 with a search report(dated Aug. 4, 2018) in the corresponding TW application(application No. 106127164).

* cited by examiner

ORGANIC ELECTROLUMINESCENT DEVICES AND MANUFACTURING METHODS THEREOF

CROSS-REFERENCE TO RELATED APPLICATIONS

This application is a National Stage of International Application No. PCT/CN2017/096646, filed on Aug. 9, 2017, entitled "ORGANIC ELECTROLUMINESCENT DEVICE AND PREPARATION METHOD THEREOF", which is hereby incorporated by reference in its entirety.

FIELD

The present disclosure relates to the field of flat panel display technology, and particularly relates to an organic electroluminescent device and a manufacturing method thereof.

BACKGROUND

Conventional organic electroluminescent devices (such as, organic light emitting display and OLED) are classified into active organic electroluminescent device (AMOLED) and passive organic electroluminescent device (PMOLED). However, a photolithography process, i.e., etching by using a photomask, is generally used in the patterning of some layers, whether in a manufacturing process of AMOLED or PMOLED.

At present, four photolithography steps are generally required in the manufacturing process of PMOLED. For a conventional process flow, the layers to be subjected to the photolithography processes in sequence are as follows: PM (metal layer)→PT (ITO layer)→PI (insulative layer)→PR (isolation pillar layer). For a post-plating process flow, the layers to be subjected to the photolithography processes in sequence are as follows: PT (ITO layer)→PM (metal layer) →PI (insulative layer)→PR (isolation pillar layer). In all of these photolithography processes, a photomask is required to etch a pattern. After the manufacture of these layers is completed, evaporation plating processes of organic material and cathodes are performed, followed by a packaging process, and finally a module flow. A similar manufacturing method may be found in Chinese patent No. CN200810227260.7.

However, when the organic electroluminescent device manufactured by the above process flow is bent, PR (isolation pillar) is prone to collapse, breakage, and connection between rows. In addition, the height of an isolation pillar has an effect on film packaging and on the reliability and bendability of a flexible screen.

SUMMARY

Based on this, it is necessary to provide an organic electroluminescent device with good flexibility.

An aspect of the present disclosure is to provide an organic electroluminescent device, comprising: a substrate; a plurality of first electrodes disposed on the substrate to form a plurality of first light emitting units; an insulative layer disposed on the substrate and configured to define a pixel region of the first light emitting unit; and a plurality of second electrodes disposed on the substrate to form a plurality of second light emitting units, wherein the second electrodes are spaced apart from each other to form a plurality of isolation trenches, each isolation trench being defined between the two adjacent second electrodes.

In the above organic electroluminescent device, the isolation trench is formed between the second electrodes, and the isolation pillar is eliminated when compared with the conventional technology, thereby improving the flexibility of the organic electroluminescent device. Further, a screen body manufactured with the organic electroluminescent device has better flexibility and meets the requirement for flexible and bendable display well.

In one embodiment, the substrate is a glass substrate.

In one embodiment, a material of the first electrodes is an indium tin oxide film.

In one embodiment, a material of the second electrodes is a metal.

In one embodiment, a material of the second electrodes is aluminum or silver.

Another aspect of the present disclosure is to further provide a method for manufacturing an organic electroluminescent device, comprising the following steps:

providing a substrate provided with a plurality of first electrodes and a plurality of conductive circuits;

forming a pattern of an insulative layer on the substrate;

evaporation plating an organic light emitting material on the substrate having the plurality of first electrodes and the pattern of the insulative layer;

evaporation plating a second electrode material on the substrate, on which the light emitting material has been evaporation plated, to form a plurality of second electrodes, wherein an isolation trench is formed between the second electrodes.

In one embodiment, the step of providing the substrate having the surface provided with the plurality of first electrodes and the plurality of conductive circuits comprises:

providing a substrate, the substrate being provided with a first electrode layer and a circuit layer;

etching the circuit layer to obtain the plurality of conductive circuits;

etching the first electrode layer to obtain the plurality of first electrodes.

In one embodiment, the step of providing the substrate having the surface provided with the plurality of first electrodes and the plurality of conductive circuits comprises:

providing a substrate, the substrate being provided with a first electrode layer;

etching the first electrode layer to obtain the plurality of first electrodes;

providing a circuit layer on the substrate having the plurality of first electrodes;

etching the circuit layer to obtain the plurality of conductive circuits.

In one embodiment, the step of forming the pattern of the insulative layer on the substrate comprises:

forming an organic insulative material on the substrate continuously; exposing the organic insulative material by using a photomask capable of forming the pattern of the insulative layer; and then developing to form the pattern of the insulative layer.

In one embodiment, the method further comprises a step of packaging the substrate having the plurality of first electrodes and the plurality of second electrodes.

DETAILED DESCRIPTION OF THE EMBODIMENTS

Figure 1:
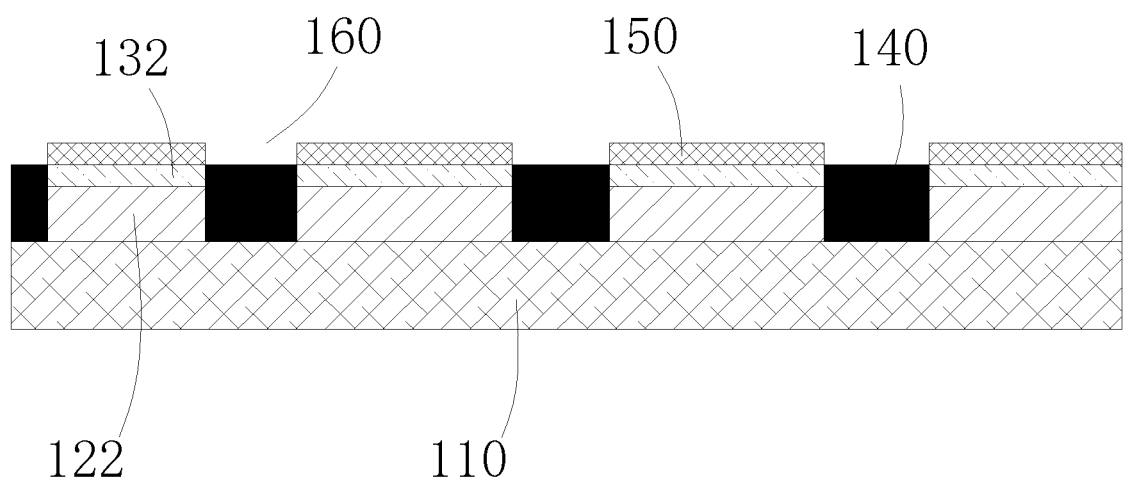
FIG. 1 is a structural schematic diagram illustrating an organic electroluminescent device according to one embodiment of the present disclosure.

Embodiments of the invention will now be described in detail with reference to the accompanying drawings, so that the above objects, features and advantages of the present disclosure will be more apparent and understandable. In the following description, numerous specific details are set forth in order to provide a thorough understanding of the present disclosure. However, the present invention may be carried out in many other ways than those described herein, and similar improvement can be made by those skilled in the art without departing from the spirit of the present disclosure. Therefore, the present invention is not limited to the specific embodiments disclosed below.

It will be understood that when a feature or element is herein referred to as being "on" another feature or element, it can be directly on the other feature or element or a intervening feature and/or element may be present. In contrast, when a feature or element is referred to as being "directly on" another feature or element, there are no intervening feature or element present. It will also be understood that, when a feature or element is referred to as being "connected" to another feature or element, it can be directly connected to the other feature or element or a intervening feature or element may be present. In contrast, when a feature or element is referred to as being "directly connected" to another feature or element, there is no intervening feature or element present.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the scope of the present disclosure.

Preferred embodiments of the present disclosure will be described hereinafter with reference to the accompanying drawings.

According to one embodiment of the present disclosure, an organic electroluminescent device (OLED) is provided.

As shown in FIG. 1, the organic electroluminescent device (OLED) comprises a substrate 110, a plurality of first electrodes 122, a conductive circuit 132, an insulative layer 140, and a plurality of second electrodes 150. The plurality of first electrodes 122 and the conductive circuit 132 are disposed on the substrate 110, each of the first electrodes 122 form a light emitting unit. The insulative layer 140 is disposed on the substrate 110 and configured to define a pixel region of the light emitting unit. The plurality of second electrodes 150 are disposed on the substrate 110 and located above the first electrodes 122 and the conductive circuit 132, each of the second electrodes 150 form a light emitting unit, wherein the second electrodes are spaced apart from each other to form an isolation trench 160. An organic light emitting material is further disposed under the second electrodes 150, but is omitted and not shown in the figure.

In this embodiment, the substrate 110 is a glass substrate, a material of the first electrodes 122 is an indium tin oxide film, and a material of the second electrodes 150 is a metal. Preferably, the material of the second electrodes 150 is aluminum or silver.

Hereinafter, a method for manufacturing the organic electroluminescent device (OLED) according to one embodiment of the present disclosure will be described in detail. The above OLED can be manufactured by this method comprising the following steps:

Step 1: providing a substrate, the substrate being provided with a plurality of first electrodes and a conductive circuit. Each of the first electrodes form a light emitting unit.

The above substrate having the plurality of first electrodes and the conductive circuit can be manufactured by the following method (by a first method).

Figure 2:
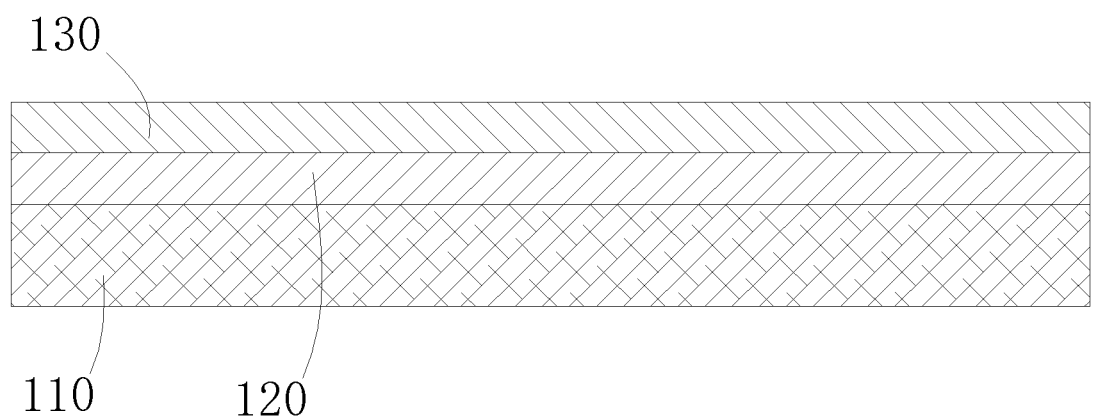
FIG. 2 is a schematic diagram illustrating a substrate provided with a first electrode layer and a circuit layer before starting to etch according to one embodiment of the present disclosure.

Referring to FIG. 2, a substrate 110 is provided firstly. A first electrode layer 120 and a circuit layer 130 have been already disposed on the substrate 110, but have not yet been subjected to a photolithography; that is, patterns of the first electrodes and the conductive circuit have not yet been formed.

The substrate 110 having the first electrode layer 120 and the circuit layer 130 may be available by purchase or may be self-made. When the substrate is self-made, it is not limited to a particular method.

A transparent glass is preferably used for the substrate 110. The first electrodes formed by the first electrode layer 120 may be an anode or a cathode, and ITO (Indium Tin Oxide) film is preferably used as a material of the first electrodes. Generally, a metal, such as MoAlMo (molybdenum aluminum molybdenum), is used as the material of the circuit layer 130.

The circuit layer 130 is firstly etched to obtain the conductive circuit 132, and then the first electrode layer 120 is etched to obtain the first electrodes 122. The final result is as shown in FIG. 1.

In addition, the above substrate having the plurality of first electrodes and the conductive circuit can also be manufactured by the following method (by a second method):

providing a substrate 110, the substrate being only provided with a first electrode layer 120, and then etching the first electrode layer 120 to obtain the first electrodes 122;

then, providing a circuit layer 130 on the substrate having the first electrodes 122, etching the circuit layer 130 to obtain the conductive circuit 132.

Step 2: forming a pattern of an insulative layer on the substrate. The pattern of the insulative layer 140 define a pixel region and may be obtained by any suitable method.

For example, the pattern of the insulative layer can be obtained by forming an organic insulative material continuously on the substrate 110, exposing the organic insulative material by using a photomask capable of forming the pattern of the insulative layer, and then developing. The organic insulative material may be a photoresist.

It should be noted that the pattern of the insulative layer given in step 2 is only an example. The insulative layer 140 defines a shape of the pixel region of the light emitting unit, thus there are different patterns of the insulative layer due to different design requirements for pixel regions of different OLEDs.

After a pattern of the insulative layer is formed, the step of evaporation plating an organic light emitting material on the pixel region is carried out. The organic light emitting material is omitted and not shown in FIG. 1.

Step 3: evaporation plating a second electrode material on the substrate, on which the organic light emitting material has been evaporation plated, by using a mask plate, to form a plurality of second electrodes 150 and a plurality of isolation trenches. Every isolation trench 160 is formed between the two adjacent second electrodes 150, as shown in FIG. 1. The second electrodes 150 form a light emitting unit. The material of the second electrodes 150 is a metal, for example, a stable pure metal, such as aluminum, silver, and the like, or an alloy. Similarly, the second electrodes 150 may be a cathode or an anode.

Specifically, evaporation plating is normally carried out after step 2 is completed. However, when a pattern of the second electrodes 150 is formed by evaporation plating, a certain distance is reserved between the second electrodes 150 of each pixel unit to form the isolation trench 160. In other words, in step 3, the isolation trench 160 is formed simultaneously, i.e. synchronously, with the evaporation plating.

The isolation trench 160 functions as electrode isolation. For example, when the second electrodes 150 serve as a cathode, two adjacent cathodes are isolated by the isolation trench 160. The isolation trench 160 is formed simultaneously while the second electrodes 150 are formed by evaporation plating. The isolation trench 160 is not a protrusion, so it will affect neither a subsequent film packaging nor bending of organic electroluminescent device, thus ensuring the flexibility of the screen body manufactured by using the organic electroluminescent device and a flexible display effect.

This step has the following advantages: firstly, no extra step is required to form the isolation pillar; secondly, the isolation trench 160 is formed between the second electrodes 150 without a protruding pillar-shaped object, and therefore will not affect the subsequent film packaging; thirdly, using the isolation trench 160 as an isolator, the screen body, when bent subsequently, is bent at the isolation trench 160, therefore, unlike the conventional solution, the case of breakage of the isolator (i.e. the isolation pillar) is not prone to occur.

Step 4: packaging the substrate 110 having the first electrodes and the second electrodes. Techniques, such as film packaging and the like, which may be used to package the OLED, will not be describe in detail herein because it is not an significant improvement of the present disclosure.

Various technical features of the above embodiments can be combined in any manner. For clarity of description, not all of possible combinations of various technical features of the above embodiments are described. However, as long as there is no contradiction in the combination of these technical features, all should be considered as within the scope described in the present specification.

The foregoing examples are merely specific embodiments of the present disclosure, which are described in detail, but they should not be construed as limiting the protection scope of the present disclosure. It should be noted that various changes and modifications can be made to the embodiments described herein by a person skilled in the art without departing from the scope and spirit of the present disclosure. Such changes and modifications are contemplated by the present disclosure, the scope of which should only be defined by the appended claims.

The invention claimed is:

1. An organic electroluminescent device, comprising:
a substrate;
a plurality of first electrodes disposed on the substrate to form a plurality of first light emitting units;
an insulative layer disposed on the substrate and defining a pixel region of the first light emitting unit; and
a plurality of second electrodes disposed on the substrate to form a plurality of second light emitting units;
wherein the second electrodes are spaced apart from each other to form a plurality of isolation trenches, each isolation trench being defined between the two adjacent second electrodes;
wherein the isolation trench is characterized by an upper surface configured lower than an upper surface of the second electrodes for electrode isolation and flexibility enhancement.

2. The organic electroluminescent device of claim 1, wherein the substrate comprises a glass substrate.

3. The organic electroluminescent device of claim 1, wherein a material of the first electrodes comprises an indium tin oxide film.

4. The organic electroluminescent device of claim 1, wherein a material of the second electrodes comprises a metal.

5. The organic electroluminescent device of claim 4, wherein a material of the second electrodes comprises aluminum or silver.

6. A method for manufacturing an organic electroluminescent device comprising the following steps:
providing a substrate provided with a plurality of first electrodes and a plurality of conductive circuits thereon;
forming a pattern of an insulative layer on the substrate;
evaporation plating an organic light emitting material on the substrate having the plurality of first electrodes and the pattern of the insulative layer; and
evaporation plating a second electrode material on the substrate to form a plurality of second electrodes, with an isolation trench formed between the two adjacent second electrodes;
wherein providing the substrate provided with the plurality of first electrodes and the plurality of conductive circuits thereon further comprises:
providing a substrate provided with a first electrode layer and a circuit layer;
etching the circuit layer to obtain the plurality of conductive circuits; and
etching the first electrode layer to obtain the plurality of first electrodes.

7. The method of claim 6, wherein providing the substrate provided with the plurality of first electrodes and the plurality of conductive circuits thereon, comprises:
providing a substrate provided with a first electrode layer;
etching the first electrode layer to obtain the plurality of first electrodes;
providing a circuit layer on the substrate having the plurality of first electrodes; and etching the circuit layer to obtain the plurality of conductive circuits.

8. The method of claim 6, wherein forming the pattern of the insulative layer on the substrate comprises:
   forming an organic insulative material on the substrate continuously;
   exposing the organic insulative material by using a photomask capable of forming the pattern of the insulative layer; and then
   developing the organic insulative material to form the pattern of the insulative layer.

9. The method of claim 6, wherein the method further comprises packaging the substrate having the plurality of first electrodes and the plurality of second electrodes.

10. An organic electroluminescent device, comprising:
    a substrate;
    a plurality of first electrodes disposed on the substrate to form a plurality of first light emitting units;
    an insulative layer disposed on the substrate and defining a pixel region of the first light emitting unit; and
    a plurality of second electrodes disposed on the substrate to form a plurality of second light emitting units;
    wherein the second electrodes are spaced apart from each other to form a plurality of isolation trenches, each isolation trench being defined between the two adjacent second electrodes; and
    wherein the isolation trench is formed simultaneously with the second electrode by reserving a predetermined distance between the two adjacent second electrodes during an evaporation plating process.

* * * * *